United States Patent [19]
Rubinstein et al.

[11] Patent Number: 5,227,959
[45] Date of Patent: Jul. 13, 1993

[54] ELECTRICAL CIRCUIT INTERCONNECTION

[75] Inventors: Leon Rubinstein, Natick; Roger A. Scott, Sterling, both of Mass.

[73] Assignees: Rogers Corporation, Rogers, Conn.; Digital Equipment Corporation, Maynard, Mass.

[21] Appl. No.: 634,620

[22] Filed: Dec. 27, 1990

Related U.S. Application Data

[60] Division of Ser. No. 864,786, May 19, 1986, abandoned, which is a continuation of Ser. No. 114,294, Oct. 27, 1987, abandoned.

[51] Int. Cl.⁵ .............................................. H01R 23/68
[52] U.S. Cl. ................................... 361/413; 361/398; 439/66; 439/91; 439/259; 439/387
[58] Field of Search ................. 361/398, 413; 439/66, 439/67, 77–79, 91, 259–265, 387

[56] References Cited

U.S. PATENT DOCUMENTS

| | | |
|---|---|---|
| Re. 31,114 | 12/1982 | Berg . |
| 1,610,555 | 12/1926 | Kindl ............................ 200/242 |
| 3,173,737 | 3/1965 | Kinkaid et al. ............. 339/176 MP |
| 3,356,983 | 12/1967 | Johnson, Jr. . |
| 3,541,222 | 11/1970 | Parks et al. . |
| 3,582,865 | 6/1971 | Franck et al. . |
| 3,587,031 | 6/1971 | Flavin . |
| 3,597,660 | 8/1971 | Jensen et al. . |
| 3,701,964 | 10/1972 | Cronin . |
| 3,705,332 | 12/1972 | Parks . |
| 3,745,509 | 7/1973 | Woodward et al. . |
| 3,873,173 | 3/1975 | Anhalt ............................ 361/403 |
| 3,999,826 | 12/1976 | Yurtin . |
| 4,092,057 | 5/1978 | Walton . |
| 4,116,157 | 9/1978 | Selvin et al. . |
| 4,125,310 | 11/1978 | Reardon, II et al. . |
| 4,164,003 | 8/1979 | Cutchaw . |
| 4,169,642 | 10/1979 | Mouissie . |
| 4,184,729 | 1/1980 | Parks et al. . |
| 4,330,163 | 5/1982 | Aikens et al. . |
| 4,392,700 | 7/1983 | Showman et al. . |
| 4,420,203 | 12/1983 | Aug et al. . |
| 4,431,242 | 2/1984 | Gisewsky . |
| 4,453,795 | 6/1984 | Moulin . |
| 4,511,197 | 4/1985 | Grabbe et al. . |

(List continued on next page.)

OTHER PUBLICATIONS

Rogers RSS Literature, 1979 Rogers Corporation, pp. 1–9.
Abbatecola et al., *IBM Technical Disclosure Bulletin* (Mar., 1968), vol. 10, No. 10, pp. 1462–1463.
Connecting Devices Bulletin, Oct., 1976 (3 pages).

(List continued on next page.)

*Primary Examiner*—Gregory D. Thompson
*Attorney, Agent, or Firm*—Fish & Richardson

[57] ABSTRACT

A high frequency electrical connector system for electrically interconnecting corresponding first and second circuit elements includes a first planar array of pad-type contact terminals disposed on a substrate and connected to a first circuit on the substrate, together with first guide structure adjacent the first array of contact terminals. A cooperating second array of pad-type contact terminals is mounted on a rigid nonconductive contact support structure that includes a resilient contact terminal array mounting, camming structure and second guide structure for cooperation with the first guide structure. The contact support structure is resiliently coupled to a carrier structure that includes cooperating camming structure. Flexible multi-conductor interconnection structure has one end electrically connected to a cooperating electrical circuit secured to the carrier structure and its other end connected to corresponding terminals of the second array. Fastener structure is adapted to secure the carrier structure and the substrate together with guide structures in engagement. As the fastener structure moves the carrier structure towards the substrate, the camming structures interact and move the contact support structure laterally (parallel to the plane of the contact arrays) in transverse wiping action, as directionally guided by the engaged first and second guide structures, to remove debris or other foreign matter (such as corrosive films) which may adversely affect electrical circuit performance.

32 Claims, 5 Drawing Sheets

U.S. PATENT DOCUMENTS

| | | |
|---|---|---|
| 4,552,420 | 11/1985 | Eigenbrode . |
| 4,553,192 | 11/1985 | Babuka et al. . |
| 4,602,317 | 7/1986 | Rovnyak et al. . |
| 4,655,524 | 4/1987 | Etzel . |
| 4,687,274 | 8/1987 | Suh et al. . |
| 4,717,345 | 1/1988 | Gordon et al. ................. 439/67 |
| 4,744,764 | 5/1988 | Rubenstein ..................... 439/62 |

OTHER PUBLICATIONS

RSS TM Rogers Solderless System for Interconnections, Copyright 1979, Rogers Corporation.

Burke, "Flex Circuit Zero Insertion Force Connector", *IBM Technical Disclosure Bulletin,* vol. 26, No. 12 (May, 1984), p. 6657.

Mersereau, Rogers Solderless System, Proceedings of the Fourth International Electronics Packaging Conference, Oct., 1984, pp. 43–53.

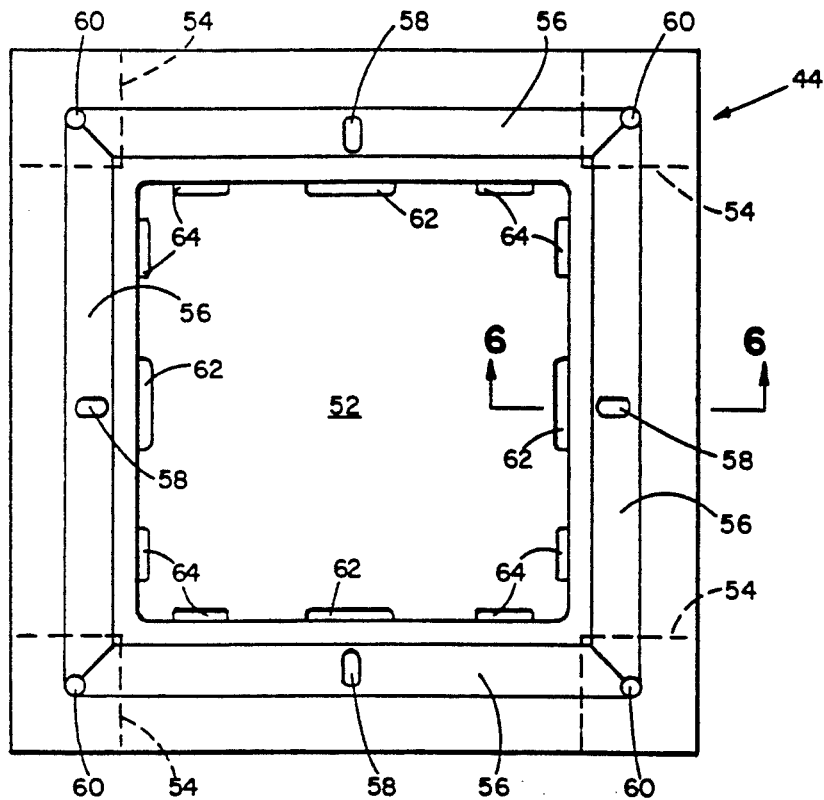
FIG 4
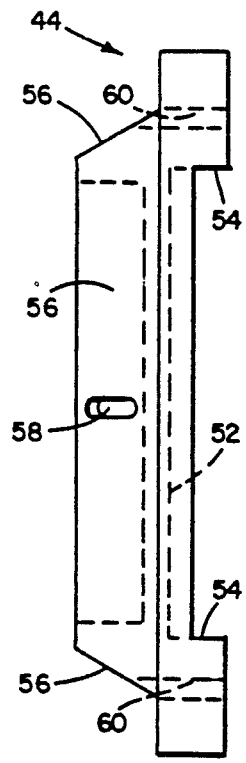
FIG 5
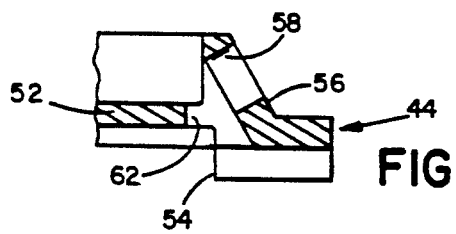
FIG 6
FIG 7
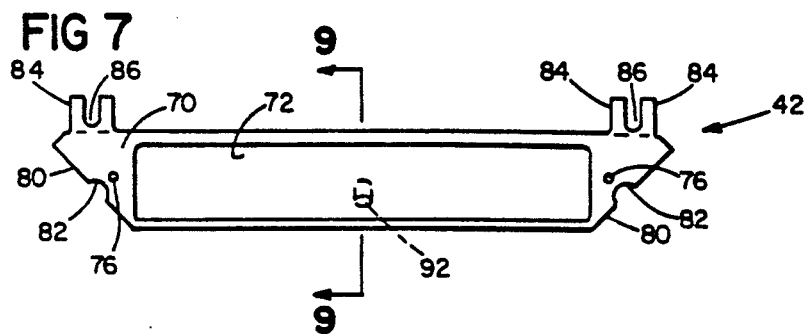
FIG 8
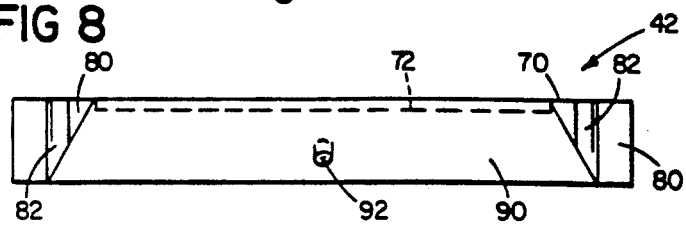
FIG 9
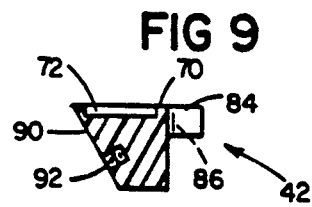

ELECTRICAL CIRCUIT INTERCONNECTION

This application is a division of U.S. Ser. No. 864,786, filed May 19, 1986, and a continuation of U.S. Ser. No. 114,294 filed Oct. 27, 1987 both now abandoned.

BACKGROUND OF THE INVENTION

This invention relates to electrical circuit interconnections, and more particularly to connector arrangements of the type useful with electronic circuit components of the semiconductor type.

Integrated circuitry developments require circuit interconnection configurations of greater density, as well as circuit path configurations that control impedance and resistive effects which may alter circuit performance. Conventionally employed methods of interconnecting electrical or electronic circuit components have included the "pin-and-socket" type and the so-called "zero force insertion" type in which a circuit card may be inserted when cooperating contacts are in an open position, and the contacts are then cammed to a closed position. These and other techniques have required substantial space or generally have a tendency to utilize complex arrangements and complicated manufacturing procedures. Additionally, certain types of commercially employed connectors cannot be easily matched in impedance to the circuit cards being connected, thus causing reflections which degrade signal quality. Such problems are particularly acute when connectors are used with newer generation semiconductors which have high switching speeds (100-500 picosecond rise time), low switching energy and signal swings in the microvolts range, the resulting disadvantages including poor signal quality caused by high crosstalk, rise time degradation, and reflections due to impedance mismatch.

SUMMARY OF THE INVENTION

In accordance with one aspect of the invention, there is provided a high frequency electrical connector system for electrically interconnecting a first circuit element with a second circuit element. The system includes a first planar array of pad type or contact or contacts terminals that are disposed on a nonconductive substrate and connected to a first circuit on the substrate, together with a first guide structure adjacent the first contact terminal array. A cooperating second array of pad-type contact terminals is mounted on a rigid nonconductive contact support structure by means of a resilient contact array mounting that includes a camming structure and second guide structure for cooperation with the first guide structure. The contact support structure is resiliently coupled to a carrier structure that includes cooperating camming structure opposed to the camming structure of the contact support structure. Flexible multi-conductor interconnection structure has one end of its conductors electrically connected to a cooperating electrical circuit secured to the carrier structure and the other end of the conductors connected to corresponding pad-type contact terminals of the second array. Fastener structure is adapted to secure the carrier structure and the substrate together with the first and second guide structures i.e., the guide structure of the contact supports and the substrate in engagement. With the arrays of planar pad-type contact terminals in face-to face engagement, as the fastener structure moves the carrier structure towards the substrate, the camming structures interact and move the contact support structure laterally (parallel to the plane of the contact arrays) in transverse wiping action as directionally guided by the engaged first and second guide structures to remove debris or other foreign matter (such as corrosive films) which may adversely affect electrical circuit performance.

In preferred embodiments, the flexible interconnector structure includes a plurality of conductor traces and a ground plane, and each conductor trace has the same characteristic impedance as other conductor traces, the clamping and wiping interactions providing circuit interconnections of minimal resistance and impedance reflection. In a particular embodiment, the pad-type contacts at one end of the flexible interconnector structure have spacing different from the spacing on center of the terminals at the other end.

Also in preferred embodiments, the second array of pad-type contact terminals lies in a plane and the camming structures of the carrier and contact support structures are planar surfaces that are disposed at an acute angle to the plane of the array of pad-type contacts; and the first guide structure includes an upstanding post member that is received in a guide slot between two spaced projecting members of the contact support when the pad-type contact arrays are in face-to-face engagement.

In a particular module-to-board connector embodiment, the carrier structure supports a module with a plurality of chip carriers and includes four planar ramp surfaces disposed in rectangular arrangement, and a corresponding contact support structure is mounted on each ramp surface. Each ramp surface has an elongated slot therein and the resilient coupling between the support structure and the carrier structure includes a post structure that extends through the ramp slot and is engaged by a spring member that biases the camming structures of the support and carrier structures into engagement with one another. The resilient contact array mounting includes a foam elastomer strip that preferably has low stress relaxation when compressed five to fifty percent of its thickness and provides conformability and controlled contact force.

In accordance with another aspect of the invention, there is provided an electrical connector arrangement of the solderless type in which first and second planar arrays of pad-type contact terminals are adapted for face to face engagement. Means are provided for moving one of the arrays of contact terminals relative to the other contact terminal array in contact wiping action for removing surface contamination.

In accordance with another aspect of the invention, there is provided an electrical connector assembly for connecting a first array of electrical contact terminals supported on a rigid member having a generally planar face with a corresponding second array of electrical contact terminals carried by a flexible circuit. The connector assembly includes a support structure having a face opposed to the planar face of the rigid member and mounted to press the flexible circuit mounted array of contact terminals toward the rigid member and move that array laterally, parallel to the face of the rigid member to provide wiping between the engaged arrays of contact terminals. The connector assembly further includes camming means supported for actuating movement in the direction perpendicular to the face of the rigid member, and movable to produce lateral motion of the support structure in response to perpendicular actuating motion of the camming means.

In particular embodiments, the support structure is of a form generally corresponding to the outline of the first array, and the camming means is of generally corresponding form and lies predominantly within lines projected perpendicular to the face of the rigid member board from the outline of the contact terminal array on that face, whereby wiping engagement of a series of close-together contacts can be achieved by means which covers little excess area of the array of contacts on the rigid circuit board. In a particular embodiment, the connector assembly includes four contact array sets, and the support structure and camming means are assembled upon a single rigid member in a hollow square pattern, and a chip carrier module is disposed on the single rigid member within the square pattern. The flexible circuits comprise controlled characteristic impedance strip means. The contacts in the arrays are spaced apart a distance of the order of 0.025 inch and provide connections with high contact density and controlled impedance.

In accordance with another aspect of the invention, there is provided electrical connector structure of the solderless type for providing electrical connections to a first array of pad-type contact terminals on a substrate or the like. The connector structure includes contact support structure that carries a corresponding array of resiliently mounted pad-type contact terminals and has a camming surface. The contact support structure is resiliently coupled to a carrier structure that includes camming structure that engages the contact support structure camming surface. Extending from the fixed array of pad-type contact terminals of the array carried by the contact support structure is flexible plural or multi-conductor interconnection structure that has electrical terminals at its other end connected to circuits on the carrier structure. With the pad-type contact terminal array in face-to-face engagement, movement of the carrier structure toward the first planar array causes the camming surface structure to produce lateral movement of the contact support structure and wiping action of the engaged pad-type contact terminal arrays, providing low resistance circuit interconnections.

In a particular embodiment, one or more chip carriers are on a module that is mounted on the carrier structure and terminals of the module are fixed to conductor traces of a flexible sheet-form interconnector structure that includes a ground plane impedance control trace and a low loss, low dielectric constant member, each conductor trace having a characteristic impedance matched to the impedance of the integrated circuit. A pad-type contact terminal is at the other end of each conductor trace, those pad-type contact terminals being spaced less than 0.100 inch on center and disposed in a planar array that is secured to a carrier bar.

The connector assembly provides a controlled impedance connection with low crosstalk and high propagation velocity in an environmentally reliable, high density interconnection which is electrically invisible even at very high frequencies.

Other features and advantages of the invention will be seen as the following description of a particular embodiment progresses, in conjunction with the drawings.

PREFERRED EMBODIMENTS

We first briefly describe the drawings.

FIG. 4 is a plan view of the carrier frame member of FIG. 3;

FIG. 5 is a side view of the frame member of FIG. 4;

FIG. 6 is a sectional view taken along the line 6—6 of FIG. 4;

FIG. 7 is a plan view of a contact support bar of the terminal support assembly of FIG. 3;

FIG. 8 is a front view of the support bar of FIG. 7;

FIG. 9 is a sectional view taken along the line 9—9 of FIG. 7;

DESCRIPTION OF PARTICULAR EMBODIMENT

Figure 1:
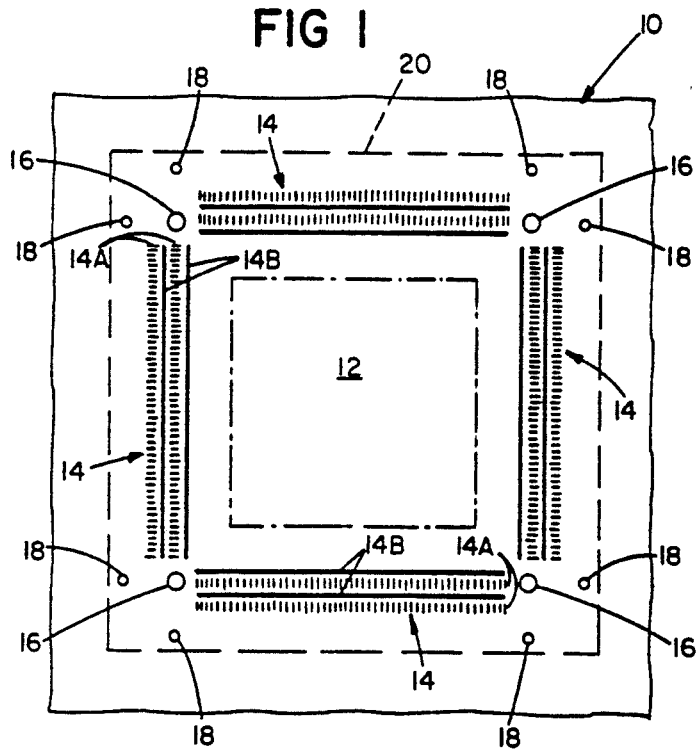
FIG. 1 is a plan view of a printed circuit board with a rectangular array of terminals.

FIG. 1 is a diagrammatic view of a circuit board or substrate 10 on which is disposed one or more printed circuits, represented by area 12, with an associated rectangular "footprint" in the form of two rows of pad-type contact terminals in a terminal array 14 (signal terminals 14A and ground terminals 14B). As is known, terminals 14 are connected to circuit(s) 12 (which may be located inside or outside "footprint" 14 (or both)) via plated-through holes to connector traces on the reverse side of the substrate. In a particular embodiment, contact pads or terminals 14A of array 14 have dimensions of about 0.008 inch (0.2 mm) by 0.100 inch (2.5 mm) and are disposed on 0.025 inch (0.6 mm) centers. At each corner of the array of terminals is a fastener-receiving aperture 16 and two upstanding guide posts 18. Substrate 10 may be of suitable insulating material such as polyimide glass or epoxy glass, and an appropriate stiffening plate 20 may be secured on the rear side of the substrate 10 in alignment with terminal array 14 and alignment posts 18.

Figure 2:
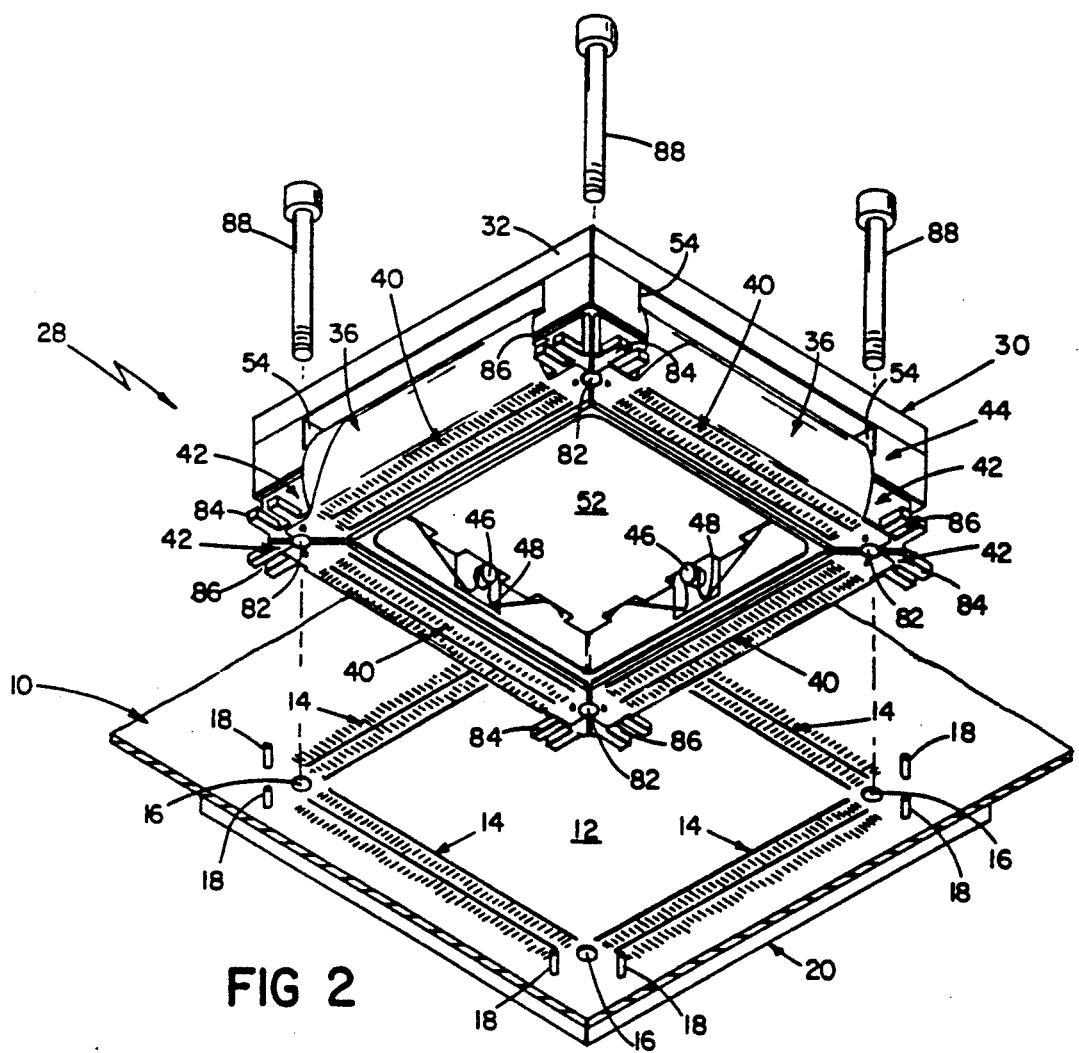
FIG. 2 is a perspective view of a module-to-board connector assembly in accordance with the invention for cooperation with the printed circuit board of FIG. 1, showing a chip carrier module and contact array.

Cooperating with printed circuit substrate 10 and terminal array 14 (as shown in FIG. 2) is connector assembly 30 that includes module 32 on which circuit element (such as one or more chips or chip carriers, (not shown) are mounted and that has a rectangular array of corresponding terminals 35 (FIGS. 11 and 12) to which are soldered flexible plural conductor (preferably microstrip or strip line) fifty ohm characteristic impedance transmission line circuits 36 that fan out to the contact density of the circuit board 10. Each flexible circuit 36 has one or more rows of contact pad-type terminals in terminal array 40 at its other ends of the same size and spacing as terminal array 14. The four terminal arrays 40 are secured on corresponding carrier bars 42 that are in turn resiliently secured to carrier frame 44 by post structures 46 and spring members 48.

Figure 3:
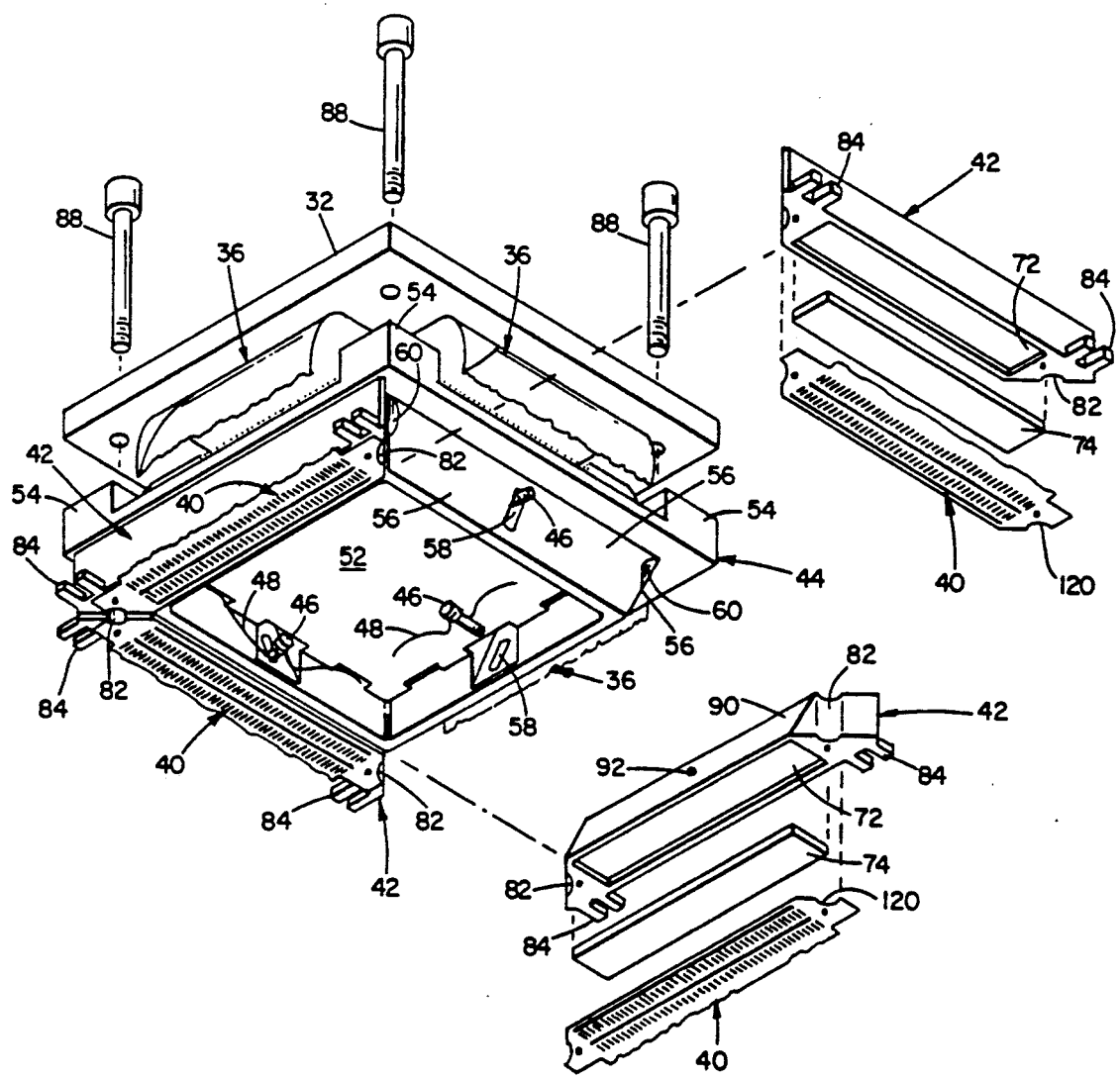
FIG. 3 is an exploded perspective view of components of the chip carrier module and contact array of FIG. 2, showing a terminal support assembly.

Connector assembly 30 is shown in exploded view in FIG. 3, and further details of carrier frame 44 may be seen with reference to FIGS. 4-6. Carrier frame 44 includes a transverse plate 52 with corner post structures 54 on one side on which module 32 is secured. Upstanding from the other side of plate 52 is a camming structure of rectangular configuration that includes a set of four planar ramp surfaces 56, each of which is disposed at an angle of 60° to the plane of plate 52. Centrally located in and extending perpendicularly through each ramp surface 56 is an elongated slot 58. At each corner of the ramp structure 56 is a fastener aperture 60. A clearance recess 62 is formed in base plate 52 in general alignment with slot 58, and a spring tip capturing recess 64 is formed in plate 52 on either side of each clearance recess 62.

Each carrier bar 42, as may be seen with reference to FIGS. 3 and 7-9, has a planar base surface 70 in which recess 72 is formed and receives resilient, open-cell polyurethane foam pad 74 (which may be of the type described in U.S. Pat. No. 4,468,074) such that the outer surface of pad 74 projects about one millimeter beyond surface 70 of carrier bar 42. At each end of recess 72 is a threaded fastener recess 76 that cooperates with associated fastener portions 116 of flexible transmission line circuits 36. The end surfaces 80 of bars 42 are disposed at 45° angles to the length of the bar so that the surfaces are aligned with one another in the assembly as shown in FIG. 2, and a recess 82 (and corresponding recess 120 (FIGS. 10A, 10B)) is formed in each surface for clamp fastener 88. Extending laterally from surface 70 at either end thereof are a pair of projections 84 that define a guide slot 86 that receives and cooperates with a corresponding guide post 18 on substrate 10. Each carrier bar 42 also include a ramp surface 90 that is disposed at an angle of 60° to surface 70, and in which is formed a threaded recess 92 (FIGS. 11 and 12) for receiving post structure 46.

Carrier bars 42 are assembled to carrier frame 44 with coupling post structures 46 and spring members 48 such that their ramp surfaces 90 seat on frame ramp surfaces 56. Coupling post structures 46 extend through slots 58 and are threadedly secured in recesses 92, the central portion of each stainless steel spring 48 is captured on the head of its post 46 and its end portions are seated in frame recesses 64, as indicated in FIG. 2, so that springs 48 bias the ramp surfaces 90 of carrier bars 42 against and along frame ramp surfaces 56 away from frame plate 52. The pad-type contact terminal arrays 40 of flexible transmission line circuits 36 are secured to carrier bars 42 by threaded fasteners 98 in threaded fastener recesses 76.

In this connector embodiment, two superimposed flexible transmission line circuits 36 (FIGS. 11, 12) are secured to each carrier bar 42, and provide a transition in terminal density between chip carrier module 32 (0.015 inch on center terminals spacing) and pad-type contact terminal arrays 40 (0.025 inch on center pad spacing). Details of those flexible transmission line circuits 36 may be seen with reference to FIGS. 10A-D. Each flexible circuit 36A, 368 is of "microstrip" configuration and includes one ounce copper ground plane 100 that terminates in exposed ground terminal strips 102, 104 at opposite ends of the circuit (the ground terminal strips 104 corresponding to contact pads 40A of FIG. 10D), three mil thick glass reinforced fluorocarbon (Rogers RO-2500) dielectric 106 that has a low dielectric constant (2.5) and a low loss factor, a set of one ounce copper conductive circuit traces 108A, 108B (each 0.006 inch in width) that extend between terminals pads 110 (0.050 inch long and 0.008 inch wide on 0.015 inch centers) and terminals pads 112 (0.080 inch long and 0.008 inch wide on 0.025 inch centers) and 0.003 inch cover film 114, the flexible circuits providing controlled impedance high density transmission line conductors (traces 108) between terminal strip 102 and terminal pad 110 that are soldered to chip carrier module 32 and terminal strip 104 and terminal pads 112 (the signal pads 112 corresponding to contact pads 40B of FIG. 10D). At either end of the contact pad terminal array 40 is a fastener portion 116 that includes an aperture 118 through which a threaded fastener 98 (FIG. 2) extends into its corresponding threaded fastener hole 76 (FIG. 7) (the fastener portions 116 being spaced about 2.5 centimeters apart).

The conductive circuit traces 108 are one ounce (1.4 mil) copper and pads 112 are copper plated to about two ounces (about 3 mils).

Figure 10A:
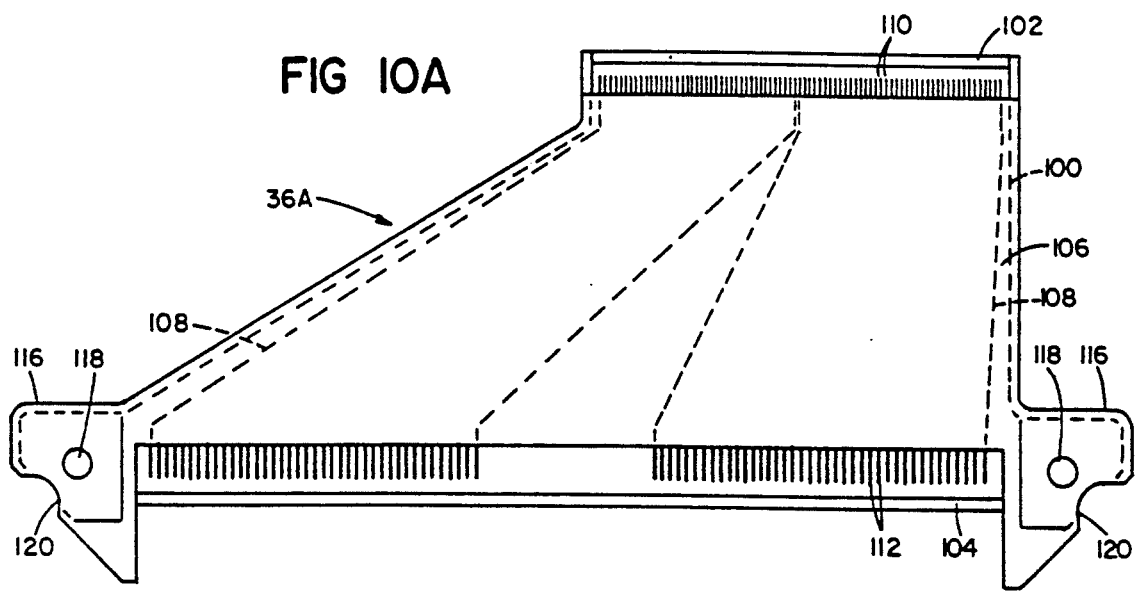
FIGS. 10A and 10B are plan views of flexible signal conductor arrays employed in a particular embodiment of the invention.
Figure 10B:
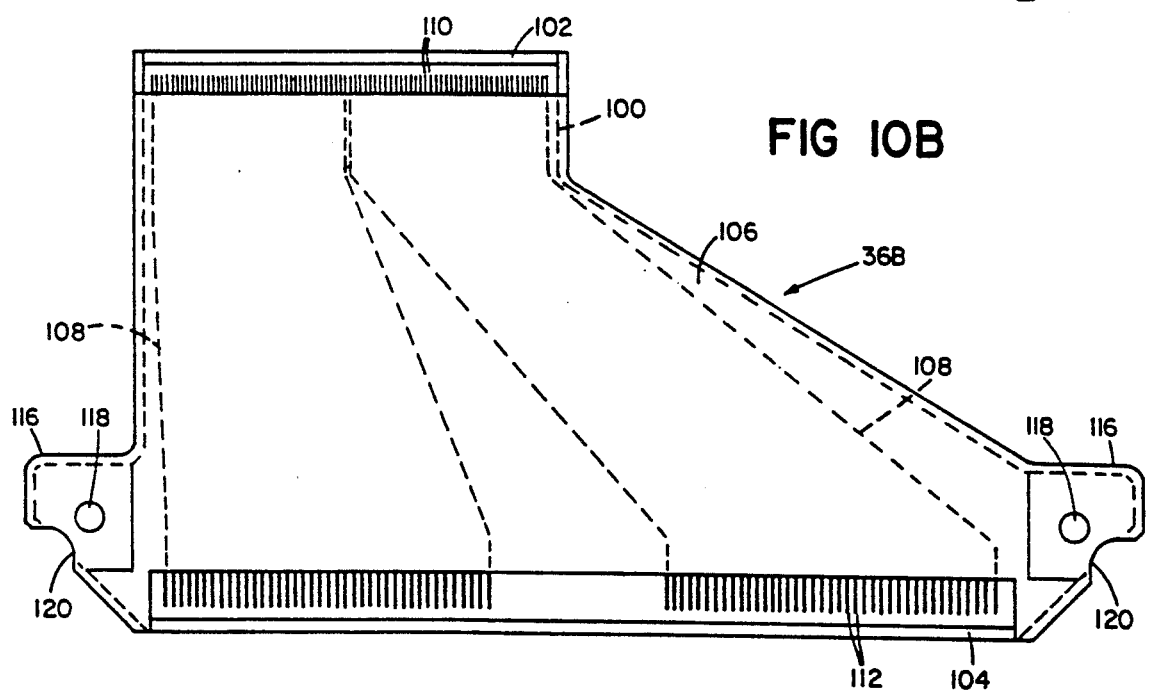
Figure 10C:
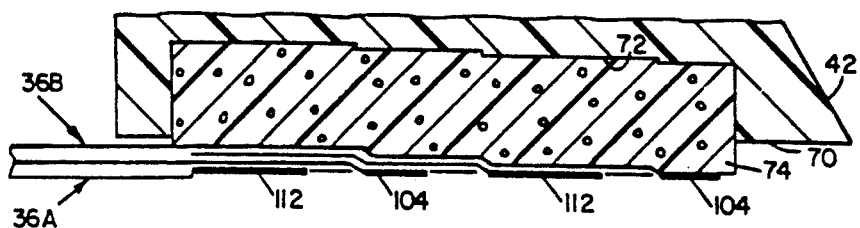
FIG. 10C is an enlarged diagrammatic view of the superimposed contact arrays.
Figure 10D:
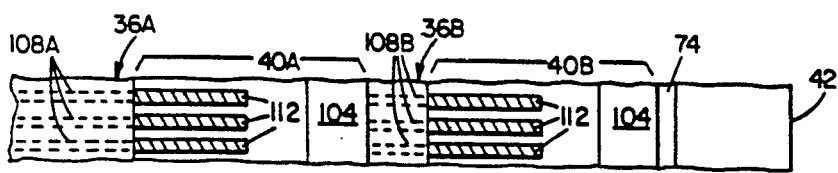
FIG. 10D is a plan view of the contact arrays shown in FIG. 10C.
Figure 11:
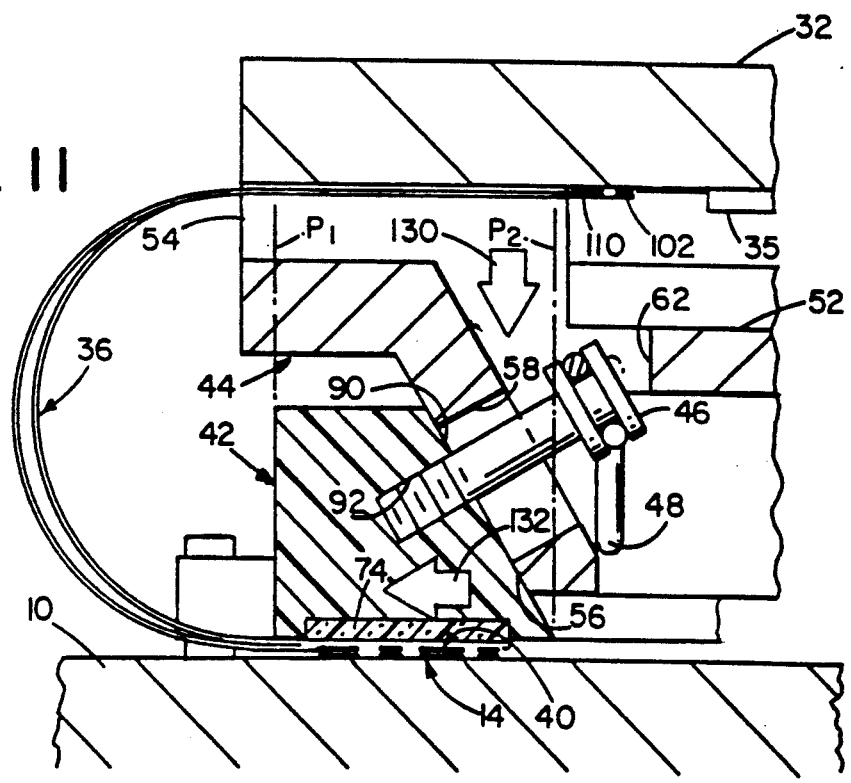

Referring, e.g., to FIG. 11 in conjunction with FIG. 1, and also with reference to FIGS. 10A-10B, the outlines of the arrays of contacts 14 on the circuit board 10 (and the corresponding arrays 40 on the flexible circuits 36) are of elongated form. The carrier bars 42 are of corresponding form. The camming structure that lies directly above each bar 42 is also of generally corresponding form (see, e.g., FIG. 3). lying predominantly within projection lines $P_1$ and $P_2$ (FIG. 11), projected perpendicular to the face of the circuit board 10 from the outline of the carrier bar 42. Areas covered by the actuating mechanisms, i.e., camming ramp surfaces 56, 90, posts 46, etc., are substantially the same as those covered by the mating contact arrays, i.e.. 14, 40, leaving adjoining areas of the circuit board available, e.g., for the mounting of components. For instance, in the square of terminal array 14 shown, e.g., in FIG. 1, a component, e.g., an active electrical component or a cooling device, can be mounted on the same side of the board as the contacts, and other electrical components mounted outside of the terminal array on the same side of the board as the contacts.

Figure 12:
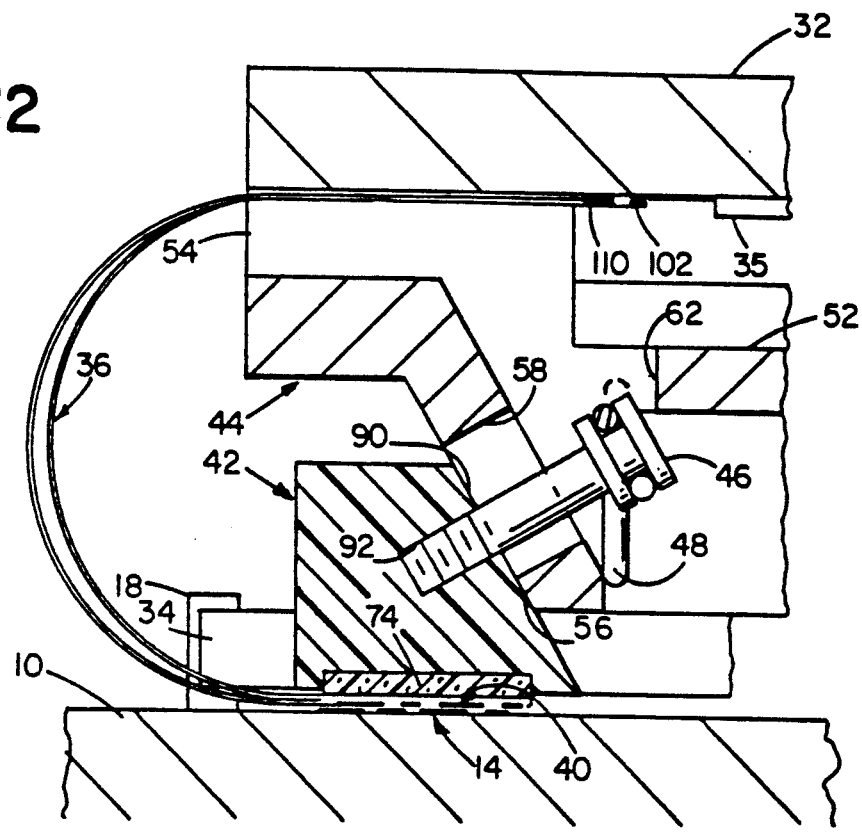
FIGS. 11 and 12 are sectional diagrammatic views illustrating the wiping and electrical connection actions of the connector assembly of FIG. 2.

Interaction of the contact assembly 28 (FIG. 2) with the substrate 10 is indicated diagrammatically in FIGS. 11 and 12. Contact assembly 28 is disposed on circuit board 10 as indicated in FIG. 11, with contact pad array 40 seated on but inwardly offset from cooperating substrate pad array 14. As fasteners 88 are tightened to urge contact assembly 28 toward substrate 11, (in the direction of arrow 130), the ramp surfaces 56 of frame 44 slide along ramp surfaces 90 of carrier bars 42 against the biasing forces of springs 48 and producing a transverse outward (sliding) movement (in the direction of arrow 132) and wiping action of terminal pads 112 of contact pad array 40 across substrate contact pad array 14. That wiping action removes debris and surface contamination and, to with resilient actions of springs 48 and pad array 74, produces durable, electrically invisible (to pulses with 35 picosecond rise times at the pulse generator), low contact resistance (one to three milliohm) circuit interconnections with clamping forces of about thirty psi.

The disclosed connector assembly provides multiple electrical connections in an arrangement resistant to mechanical and thermal shock which is relatively inexpensive to manufacture, simple to utilize, readily replaceable without the use of solder, and provides reliable circuit interconnections with distributed mating forces and wiping actions of pad-type contacts. While particular embodiments have been shown and described, various modifications will be apparent to those skilled in the art, and therefore it is not intended that the invention be limited to the disclosed embodiments or to details thereof, and departures may be made therefrom within the spirit and scope of the invention.

What is claimed is:

1. An electrical connector system electrically interconnecting a first circuit with a second circuit comprising
   A. a substrate on which said first circuit is disposed, a first array of pad-type contact terminals on said substrate electrically connected to said first circuit, and said first guide structure on said substrate adjacent said first array of contact terminals,
   B. contact support structure having a second array of pad-type contact terminals mounted on said contact support structure by means of a resilient contact array mounting, said contact support structure including camming structure and a second guide structure adapted for cooperation with said first guide structure,
   C. carrier structure that includes camming structure opposed to said camming structure of said contact support structure, means coupling said contact support structure to said carrier structure in a manner enabling said opposed camming structures to engage,
   D. multi-conductor flexible interconnection structure having a plurality of conductors, one end of said conductors being electrically connected to respective terminals of said second circuit and the other end of said conductors connected to corresponding pad-type contact terminals of 25 said second array, and
   E. fastener structure operable, with said first and second arrays of pad type contact terminals in face-to-face engagement of a plane and the first and second guide structures in engagement, to move said carrier structure toward said substrate, said movement toward said substrate causing said engaged camming structures to produce lateral movement of said contact support structure parallel to the plane of engagement of the contact terminal arrays in wiping action as guided by said engaged first and second guide structures.

2. The connector system of claim 1 wherein said flexible multiconductor interconnection structure includes at least one ground plane, each of said plurality of conductors having the same characteristic impedance and each being impedance matched to the circuits being interconnected.

3. The connector system of claim 1 wherein said circuits are of the semiconductor type.

4. The connector system of claim 1 wherein said second array of pad-type contact terminals lies in a plane and said camming structure of said contact support structure is a planar surface disposed at an acute angle to said plane of said second array.

5. The connector system of claim 1 wherein said first guide structure includes an upstanding post member, and said second guide structure includes two spaced projecting members that define a guide slot therebetween receiving said upstanding guide post member.

6. The connector system of claim 1 wherein said camming structure of said carrier structure is a planar ramp surface.

7. The connector system of claim 1 wherein said fastener structure between said support structure and said carrier structure includes means for resiliently biasing said camming structures of said support and carrier structures into engagement.

8. The connector system of claim 7 wherein said fastener structure is disposed midway between the ends of said support structure.

9. The connector system of claim 1 in combination with a plurality of further said connector systems which share the substrate of the first mentioned connector system said connector system, disposed in a polygon arrangement on said shared substrate.

10. The connector system of claim 1 wherein said resilient contact array mounting includes a resilient pad.

11. The connector system of claim 1 wherein said flexible interconnection structure has a plurality of conductors with spacing of contact terminals at one end of respective conductors different from the spacing of the contact terminals at the other end of said conductors.

12. An electrical connector system for electrically interconnecting a first array of pad-type contact terminals of a first circuit disposed on a substrate with a second circuit comprising
   contact support structure having a second array of pad-type contact terminals mounted on a contact support structure by means of a resilient contact array mounting, said contact support structure including camming structure,
   carrier structure that includes camming structure opposed to said camming structure of said contact support structure, means coupling said contact support structure to said carrier structure in a manner enabling said opposed camming structures to engage, multi-conductor flexible interconnection structure having a plurality of conductors, one end of said conductors being electrically connected to respective terminals of said second circuit and the other end of said conductors connected to corresponding pad-type contact terminals of said second array, and
   with said pad-type contact terminals of said first and second arrays in face-to-face engagement at a plane, said carrier structure adapted for movement to cause said engaged camming structures to produce lateral movement of said contact support structure parallel to the plane of engagement of the contact terminals in wiping action.

13. The connector structure of claim 12 wherein said flexible multi-conductor interconnection structure includes at least one ground plane, each of said plurality of conductors having the same characteristic impedance and each being impedance matched to the circuits being interconnected.

14. The connector structure of claim 13 wherein said circuit elements are of the semiconductor type.

15. The connector structure of claim 14 wherein said second array of pad-type contact terminals lies in a plane and said contact support camming structure is a planar surface disposed at an acute angle to said plane of said second planar array of pad-type contact terminals.

16. The connector system of claim 1 in combination with a plurality of further said connector system which share the substrate of the first mentioned connector system said connector system disposed in a polygon arrangement on said shared substrate.

17. The connector structure of claim 16 wherein said resilient contact array mounting includes a resilient pad.

18. The connector structure of claim 17 wherein said flexible multi-conductor interconnection structure has spacing of the terminals at one end of said conductors different from the spacing of said pad-type contact terminals at the other end of the conductors.

19. A high frequency electrical connector system for electrically interconnecting a first circuit element with a second circuit element comprising
 a substrate on which said first circuit element is disposed, a first planar array of pad-type contact terminals on said substrate connected to said first circuit element, and first guide structure adjacent said first array of contact terminals,
 rigid nonconductive contact support structure that includes camming structure and a second guide structure adapted for cooperation with said first guide structure, a cooperating second planar array of pad-type contact terminals mounted on said rigid contact support structure by means of resilient contact array mounting,
 rigid nonconductive carrier structure that includes camming structure opposed to said camming structure of said contact support structure, means resiliently coupling said support structure to said carrier structure with said camming structures in engagement, and means for securing said second circuit element to said carrier structure,
 multi-conductor flexible interconnection structure having a plurality of conductors, one end of said conductors being electrically connected to respective terminals of said second circuit element and the other end of the conductors connected to corresponding pad-type contact terminals of said second array, and
 fastener structure operable, with said first and second pad-type contact terminal arrays in face-to-face engagement of a plane and the first and second guide structures in engagement, to move said carrier structure towards said substrate, said movement towards said substrate causing said engaged camming structures to produce lateral movement of said contact support structure, parallel to the plane of engagement of the contact terminal arrays, in wiping action as guided by said engaged first and second guide structures.

20. The connector system of claim 19 wherein said flexible interconnector structure includes at least one ground plane, each of said plurality of conductors having the same characteristic impedance and each being impedance matched to the circuits being interconnected.

21. The connector system of claim 20 wherein said second array of pad-type contact terminal lies in a plane and said camming structure of said contact support is a planar surface disposed at an acute angle to said plane of said second array.

22. The connector system of claim 21 wherein said first guide structure includes an upstanding post member, and said second guide structure includes two spaced projecting members that define a guide slot therebetween receiving said upstanding guide post.

23. The connector system of claim 19 wherein said substrate is a circuit board on which said first circuit element is disposed, said second circuit element is a chip carrier disposed on a module secured to said carrier structure.

24. The connector system of claim 23 wherein said carrier structure is of rectangular configuration and has four camming surface structures disposed about its periphery, and four contact support structures are disposed about the periphery of said rectangular carrier structure and are resiliently biased against corresponding camming surfaces of said carrier structure by fastener structures.

25. The connector system of claim 24 wherein said flexible interconnection structure includes at least one ground plane, each of said plurality of conductors having the same characteristic impedance and each being impedance matched to the circuits being interconnected.

26. An electrical connector assembly for connecting electrical contact terminals supported on a rigid member with corresponding electrical contact terminals carried by a flexible circuit, the connector assembly comprising
 a rigid member having a generally planar face supporting a first array of electrical contact terminals,
 flexible circuit means having a broad surface upon which is disposed a corresponding second array of electrical contact terminals,
 a support structure having a face opposed to said planar face of said rigid member, the portion of said flexible circuit means having said second array of contact terminals being supported by said support structure face, with said second array of contact terminals exposed for engagement with said first array of contact terminals,
 said support structure being mounted to press toward said rigid member and move laterally parallel to said face of said rigid member to provide wiping action between said arrays of contact terminals as they engage, and
 camming means having a camming surface engaged upon a corresponding surface of said support structure and movable to produce said lateral motion of said support structure while said arrays of contact terminals engage,
 said camming means being supported for actuating movement in the direction perpendicular to the face of said rigid member, and said support structure and camming means having mating camming structure arranged to produce said lateral motion of said support structure in response to said perpendicular actuating motion of said camming means.

27. The connector assembly of claim 26 wherein said rigid member comprises a circuit board,
 said support structure is of a form generally corresponding to the outline of said second array, and
 said camming means is of generally corresponding form and lies predominantly within projection lines projected perpendicular to the face of said rigid circuit board from the outline of said support structure,
 whereby wiping engagement of a series of close-together contact terminals can be achieved by means which covers little excess area of the first array of contact terminals on said rigid circuit board.

28. The connector assembly of claim 26 or 27 wherein said flexible circuit means comprises controlled characteristic impedance strip means and contact terminals in said arrays are spaced apart to achieve connections with high contact density and controlled impedance.

29. The connector assembly of claim 27 wherein said flexible circuit means carrying said second array of contact terminals comprises a multiplicity of flexible circuit strips, each carrying a sub-array of contact terminals, said sub-arrays together defining said second array.

30. The connector assembly of claim 27 or 29 wherein the outlines of said first and second array of contact terminals are of corresponding narrow elongated form, and said support structure and camming means are of corresonding elongated, bar form.

31. The connector assembly of claim 30 wherein four sets of said arrays of contact terminals, support structure and camming means are assembled upon a single rigid member in a hollow rectangular or square pattern.

32. The connector assembly of claim 31 wherein a module is disposed upon said single rigid member within said rectangular or square pattern.

* * * * *